United States Patent
Trattler

(10) Patent No.: US 8,274,411 B2
(45) Date of Patent: Sep. 25, 2012

(54) CIRCUIT ARRANGEMENT AND METHOD FOR THE OPERATION OF A CIRCUIT ARRANGEMENT

(75) Inventor: Peter Trattler, Graz (AT)

(73) Assignee: Austriamicrosystems AG, Unterpremstätten (AT)

( * ) Notice: Subject to any disclaimer, the term of this patent is extended or adjusted under 35 U.S.C. 154(b) by 561 days.

(21) Appl. No.: 12/525,668

(22) PCT Filed: Jan. 31, 2008

(86) PCT No.: PCT/EP2008/051219
§ 371 (c)(1),
(2), (4) Date: Nov. 9, 2009

(87) PCT Pub. No.: WO2008/092931
PCT Pub. Date: Aug. 7, 2008

(65) Prior Publication Data
US 2010/0060490 A1    Mar. 11, 2010

(30) Foreign Application Priority Data
Feb. 2, 2007 (DE) .......................... 10 2007 005 374

(51) Int. Cl.
*H03M 11/00*  (2006.01)
(52) U.S. Cl. ............ 341/26; 341/22; 345/156; 345/168; 340/14.1
(58) Field of Classification Search .............. 341/22, 341/26; 340/14.1, 2.2, 2.27, 2.28; 345/156, 345/168
See application file for complete search history.

(56) References Cited

U.S. PATENT DOCUMENTS

| | | | |
|---|---|---|---|
| 4,234,872 A * | 11/1980 | Halder | 341/26 |
| 4,471,234 A | 9/1984 | Horiuchi | |
| 5,189,417 A * | 2/1993 | Caldwell et al. | 341/26 |
| 5,270,711 A * | 12/1993 | Knapp | 341/34 |
| 5,495,077 A * | 2/1996 | Miller et al. | 178/18.06 |
| 5,929,790 A * | 7/1999 | Lim | 341/22 |
| 6,320,282 B1 * | 11/2001 | Caldwell | 307/125 |
| 6,509,846 B1 * | 1/2003 | Fujiki | 341/26 |
| 6,563,434 B1 * | 5/2003 | Olodort et al. | 341/22 |
| 7,042,341 B2 | 5/2006 | McMahon | |

(Continued)

FOREIGN PATENT DOCUMENTS

CH           625 072         8/1981

(Continued)

OTHER PUBLICATIONS

"AS3688 Flexible Lighting Management (Charge Pump, DCDC Step Up, Current Sink, ADC, LDO)", austriamicrosystems AG, Preliminary Product Brief, Dec. 5, 2005.

(Continued)

*Primary Examiner* — Linh Nguyen
(74) *Attorney, Agent, or Firm* — Cozen O'Connor

(57) ABSTRACT

A circuit arrangement (1) comprises a current source (10), a comparator (50) and a control device (90). The current source (10) serves for supplying a light-emitting diode (41). The comparator (50) may be coupled to the light-emitting diode (41) at a first input (51) via a push-button (101). The comparator (50) may be fed with a reference voltage (VREF) at a second terminal (52). The control device (90) selectively puts the current source (10) into a first operational state (A) for polling a push-button position of the push-button (101) or into a second operational state (B) for emitting radiation by means of the light-emitting diode (41).

16 Claims, 7 Drawing Sheets

U.S. PATENT DOCUMENTS

| | | | |
|---|---|---|---|
| 7,109,955 B2 * | 9/2006 | Ishizuka et al. | 345/76 |
| 7,339,499 B2 * | 3/2008 | Khlat | 341/26 |
| 7,782,230 B2 * | 8/2010 | Olodort et al. | 341/22 |
| 8,004,500 B2 * | 8/2011 | Elias | 345/174 |
| 2002/0175835 A1 | 11/2002 | Falik et al. | |
| 2005/0036294 A1 | 2/2005 | McMahon | |
| 2006/0284741 A1 | 12/2006 | Khlat | |

FOREIGN PATENT DOCUMENTS

| | | |
|---|---|---|
| DE | 35 40 434 | 5/1987 |
| DE | 39 01 636 | 8/1989 |
| DE | 197 32 283 | 3/1999 |
| EP | 0 408 765 | 1/1990 |
| JP | 2000-232241 | 8/2000 |
| JP | 2005-116683 | 4/2005 |

OTHER PUBLICATIONS

"AS3689 Flexible Lighting Management (Charge Pump, DCDC Step Up, Current Sink, ADC, LDO)", austriamicrosystems AG, Preliminary Product Brief, Dec. 5, 2005.

"Latching Pushbuttons for Instrument Control", Electronics World, vol. 106, No. 1767, p. 259/260, Mar. 1, 2000.

* cited by examiner

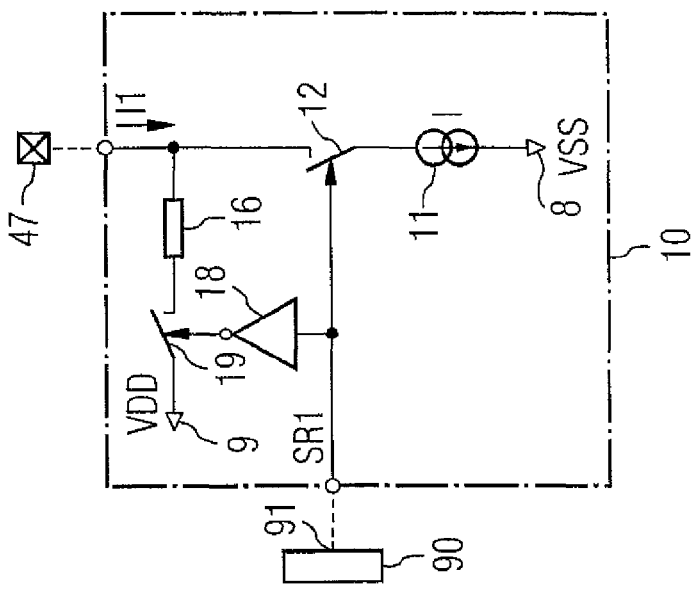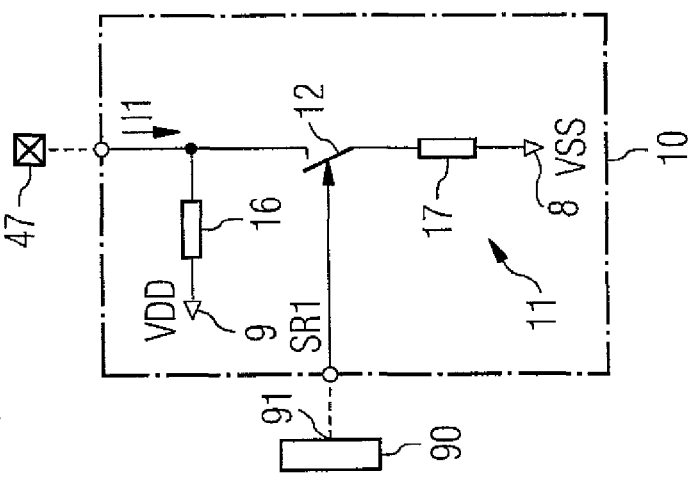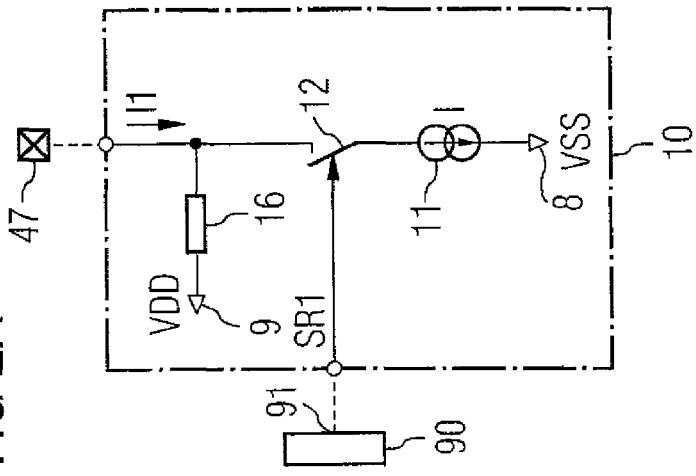

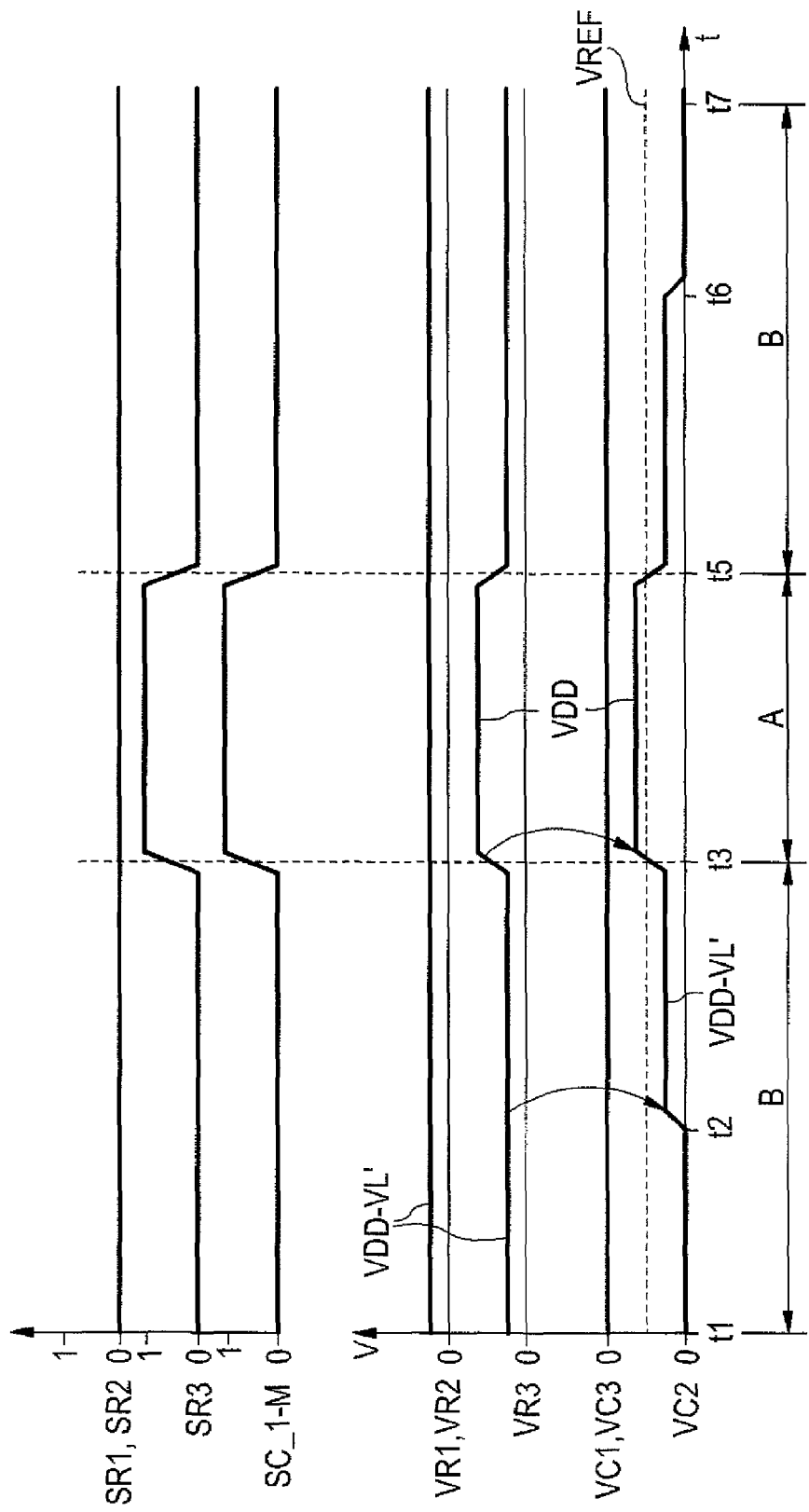

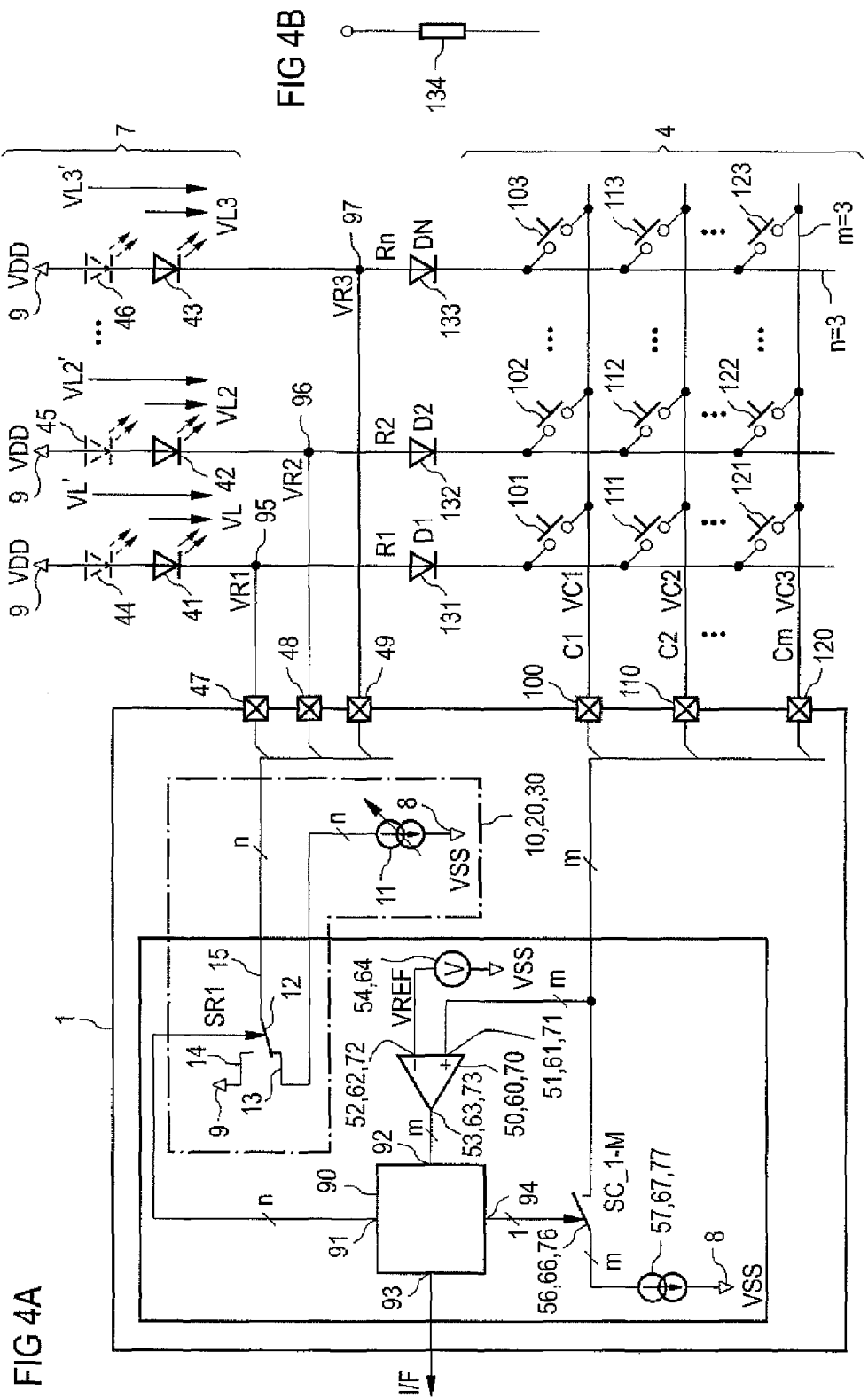

CIRCUIT ARRANGEMENT AND METHOD FOR THE OPERATION OF A CIRCUIT ARRANGEMENT

RELATED APPLICATIONS

This is a U.S. national stage of application No. PCT/EP2008/051219, filed on Jan. 31, 2008.

This application claims the priority of German application no. 10 2007 005 374.8 filed Feb. 2, 2007, the entire content of which is hereby incorporated by reference.

FIELD OF THE INVENTION

The present invention relates to a circuit arrangement and a method for operating a circuit arrangement.

BACKGROUND OF THE INVENTION

In cellular phones, it is usual to employ a first circuit arrangement for driving light-emitting diodes and a separate, second circuit arrangement for polling a keypad. A multitude of terminal lines is required in each case for connecting the first circuit arrangement to the light-emitting diode and connecting the second circuit arrangement to the keypad.

The document "AS3688 Flexible Lighting Management (Charge Pump, DCDC Step Up, Current Sink, ADC, LDO)", austria-microsystems AG, Preliminary Product Brief, describes a circuit arrangement wherein several light-emitting diodes are operated.

The document US 2006/0284741 A1 sets forth a keypad and an associated evaluation circuit.

The document U.S. Pat. No. 7,042,341 B2 deals with a circuit arrangement for polling a keypad and for operating a light-emitting diode as background lighting of the keypad.

SUMMARY OF THE INVENTION

It is one object of the present invention to provide a circuit arrangement and a method for operating a circuit arrangement with which a light-emitting diode and a push-button can be operated in an effective way.

According to one aspect of the invention, a circuit arrangement comprises a current source, a comparator and a control device. The comparator comprises first and second inputs. The first input of the comparator can be coupled to at least one light-emitting diode via a push-button.

The current source serves for supplying the at least one light-emitting diode. The control device is designed to selectively put the current source into a first operational state or into a second operational state. The first operational state of the current source is provided for polling a push-button position of the push-button. The second operational state of the current source, however, serves for emitting radiation by means of the at least one light-emitting diode. The second terminal of the comparator may be fed with a reference voltage.

The circuit arrangement is advantageously designed such that the at least one light-emitting diode is used as a lighting source in the second operational state of the current source. In the first operational state of the current source, however, a voltage is generated in the arrangement which is directed to the first input of the comparator when the push-button is actuated and correspondingly is not fed to the first input of the comparator when the push-button is not actuated. The comparator compares the voltage at its first input with the reference voltage. In this way, the push-button position of the push-button can be detected by means of the comparator in the first operational state of the current source. Thus, the current source is alternatingly employed in a very effective way for operating the at least one light-emitting diode and for operating the push-button. The comparator can be used advantageously for distinguishing between an actuated and a non-actuated push-button.

In one embodiment, the comparator may be used for distinguishing between the first and second operational states when the push-button is actuated.

The at least one light-emitting diode may represent a light-emitting diode or a series connection of at least two light-emitting diodes.

In one embodiment, a value of the reference voltage is larger than a value of a supply voltage minus a value of a light-emitting diode voltage across the at least one light-emitting diode.

In one embodiment, a semiconductor body comprises the circuit arrangement with the current source, the comparator and the control device. Thus, the circuit arrangement can be realized to advantage so as to be very compact. It is preferred that an output of the comparator is connected to the control device. Advantageously, the control device is able to synchronize the processes of putting the current source into the first or second operational state and polling a signal at the output of the comparator.

In a preferred embodiment, the current source is coupled to the at least one light-emitting diode. Advantageously, the current source is thus capable of adjusting a current flowing through the at least one light-emitting diode.

In one embodiment, the at least one light-emitting diode comprises a terminal and an additional terminal, wherein the terminal of the at least one light-emitting diode is coupled to the current source and also to the push-button.

In one embodiment, the current source is directly and immediately connected to the terminal of the at least one light-emitting diode. The current source may be permanently connected to the terminal of the at least one light-emitting diode. Advantageously, no component is thus inserted between the current source and the at least one light-emitting diode, which might cause a voltage drop and hence impair the mode of operation of the current source.

In one embodiment, the push-button is directly and immediately connected to the terminal of the at least one light-emitting diode. The push-button may be permanently connected to the terminal of the at least one light-emitting diode. A very cost-effective realization is thus made possible. As an alternative, the push-button may be connected to the terminal of the at least one light-emitting diode via a diode, a resistor or a capacitor. Advantageously, the simultaneous actuation of several push-buttons can be detected in this way.

In a preferred embodiment, the at least one light-emitting diode and the current source are provided serially relative to each other and inserted between a supply voltage terminal and a reference potential terminal. A supply voltage which is present between the supply voltage terminal and the reference potential terminal drops across the at least one light-emitting diode and the current source. The supply voltage serves for supplying the at least one light-emitting diode with energy, while the current source adjusts a level of the current flowing through the at least one light-emitting diode. In doing so, the at least one light-emitting diode may be connected to the reference potential terminal and the current source may be connected to the supply voltage terminal.

It is preferred that the at least one light-emitting diode is connected to the supply voltage terminal and the current source is connected to the reference potential terminal.

Advantageously, the current source may be driven in a particularly simple manner in case it has one terminal connected to the reference potential terminal.

In one embodiment, the at least one light-emitting diode and the push-button are arranged on a first substrate. The first substrate may be a printed circuit board. The printed circuit board may be flexible. It is preferred that the circuit arrangement comprises an output for connecting the current source to the terminal of the at least one light-emitting diode, and an input for connecting the first input of the comparator to the push-button or a first terminal of the push-button. Advantageously, only two terminals of the circuit arrangement are needed for supplying the at least one light-emitting diode and for polling the push-button. The additional connections, namely the connection from a second terminal of the push-button to the at least one light-emitting diode and from the at least one light-emitting diode to the supply voltage terminal, may be arranged on the first substrate. Thus, the number of the connections between the first substrate and a second substrate, which comprises the circuit arrangement, is kept small. This allows a well-priced realization.

The push-button may be a membrane key. The push-button may be designed so as to not snap in place. The push-button may have a snap-in function. In an alternative embodiment, the push-button is configured as an electric switch. According to the alternative embodiment, the push-button is thus not actuated mechanically, but by an electric signal.

The current source may be designed so as to be switchable. Due to the switchable design of the current source, it may be selectively put into the first or second operational state. It is preferred that the current source is switched so as to be inactive in the first operational state and active in the second operational state. In the second operational state, the current source preferably serves for adjusting a constant current for the operation of the at least one light-emitting diode. In the first operational state, the current source is preferably used for providing a constant voltage at the output side. This constant voltage may be advantageously fed to the first input of the comparator when the push-button is actuated and may be compared with the reference voltage by the comparator. When the push-button is not actuated, a voltage is preferably fed to the first input of the comparator, which is different from the voltage made available in the first operational state at the output side of the current source. It is possible in this way to distinguish between the actuated and the non-actuated push-button positions of the push-button, which is of advantage.

The circuit arrangement may be used in a device of mobile radio communication or in a portable computer.

According to another aspect of the invention, a method for operating a circuit arrangement comprises the process of putting a current source into a first operational state. In the first operational state of the current source, a push-button position of a push-button is polled. The process of polling the push-button position is effected by means of a comparator which is coupled to at least one light-emitting diode via the push-button. The method further comprises the process of putting the current source into a second operational state. The second operational state of the current source serves for supplying the at least one light-emitting diode. In the second operational state of the current source, a radiation is provided by means of the at least one light-emitting diode. The circuit arrangement comprises the current source and the comparator.

Advantageously and due to the two operational states of the current source, it is made possible in an effective method to selectively supply the at least one light-emitting diode or to poll a push-button position. For polling the push-button position, a second terminal of the push-button is supplied with an electric voltage which is fed to the comparator in case of an actuated push-button position and which is not directed to the comparator in case of a non-actuated push-button position. Advantageously, the current source may be selectively used both for supplying the at least one light-emitting diode and for polling the keypad.

In one embodiment, the push-button position of the push-button is polled by the comparator in such a manner that a voltage at a first terminal of the push-button is compared with a reference voltage the value of which is larger than a value of a supply voltage minus a value of a light-emitting diode voltage dropping across the at least one light-emitting diode.

BRIEF DESCRIPTION OF THE DRAWINGS

The invention will be explained in more detail in the following by means of several exemplary embodiments with the aid of the Figures. Components or circuit parts with the same function and effects have identical reference numerals. Insofar as circuit parts or components are identical in their function, their description will not be repeated in each of the following Figures.

In the Figures:

FIGS. 2A to 2C show three exemplary embodiments of a current source, FIGS. 3A and 3B show an additional exemplary embodiment of an arrangement and the associated signals according to the invention, FIGS. 4A to 4C show additional exemplary embodiments of an arrangement according to the invention.

BRIEF DESCRIPTION OF THE DRAWINGS

Figure 1:
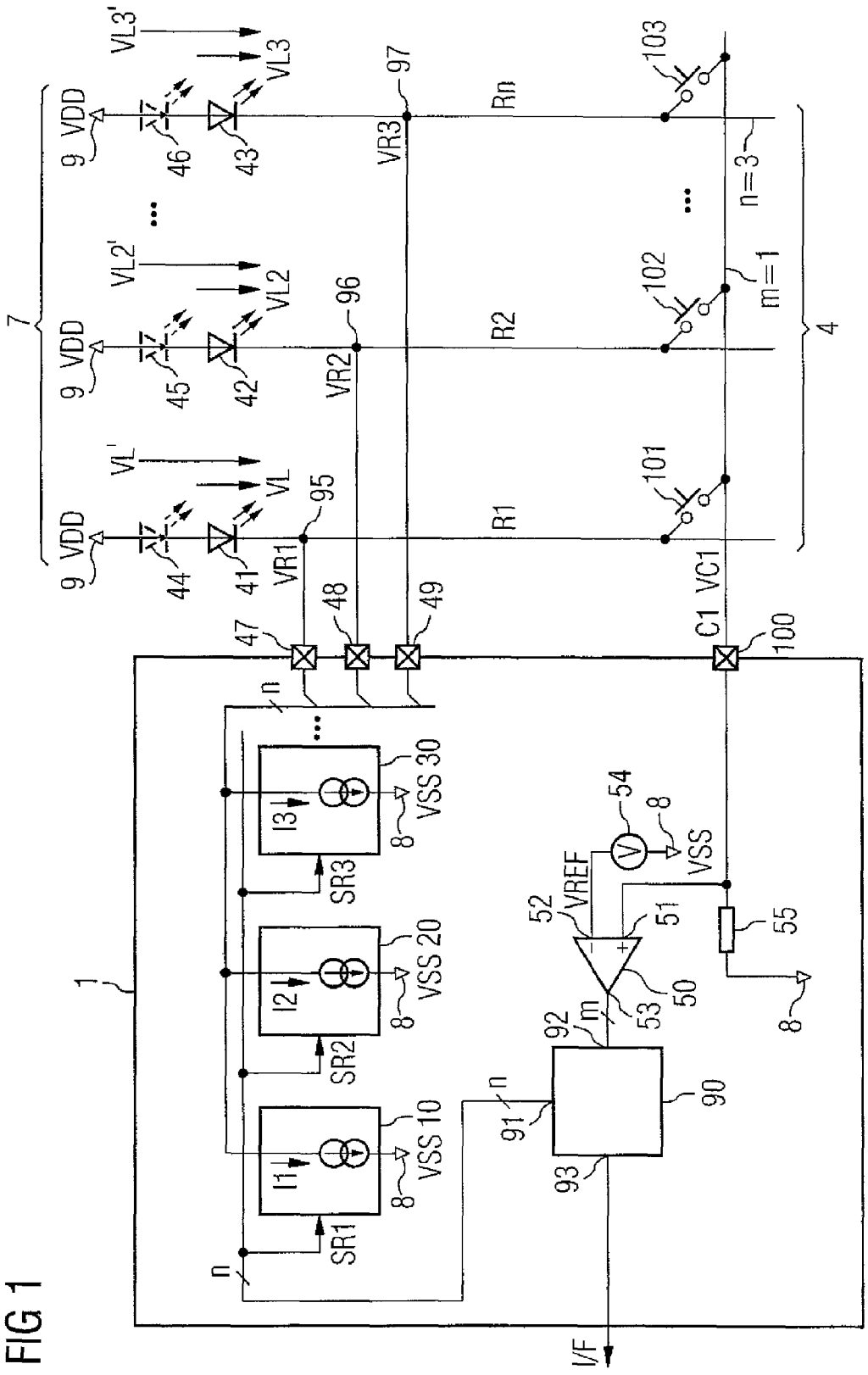
FIG. 1 shows an exemplary embodiment of an arrangement according to the invention.

FIG. 1 shows an exemplary embodiment of an arrangement according to the invention. The arrangement comprises a circuit arrangement 1 which comprises a current source 10, a comparator 50 and a control device 90. The control device 90 is connected to a control input of the current source 10 at an output 91. The current source 10 is coupled to a first output 47 of the circuit arrangement 1. The current source 10 is inserted between the first output 47 of the circuit arrangement 1 and a reference potential terminal 8. A first input 51 of the comparator 50 is connected to the first input 100 of the circuit arrangement 1. The first input 100 of the circuit arrangement 1 and thus the first input 51 of the comparator 50 are connected to the reference potential terminal 8 via a first drain resistor 55. A reference voltage source 54 is connected to the second input 52 of the comparator 50. An output 53 of the comparator 50 is connected to an input 92 of the control device 90. The control device 90 has a signal output 93.

The arrangement comprises a light-emitting diode 41 provided in serial connection with respect to the current source 10. A terminal of the light-emitting diode 41 is connected to a supply voltage terminal 9. To this end, the light-emitting diode 41 is inserted between the supply voltage terminal 9 and the first output 47 of the circuit arrangement 1. The light-emitting diode 41 is coupled to the first input 100 of the circuit arrangement 1 via a first node 95 and a first push-button 101. The first node 95 is connected to the first output 47 of the circuit arrangement 1. The first push-button 101 comprises first and second terminals. The light-emitting diode 41 is connected to the second terminal of the first push-button 101 via the first node 95. The current source 10 is connected to the second terminal of the first push-button 101 via the first node 95. The first terminal of the first push-button 101 is connected to the first input 51 of the comparator 50 via the first input 100 of the circuit arrangement 1.

The circuit arrangement 1 further comprises second and third current sources 20, 30. The output 91 of the control device 90 is connected to a control input of the second current source 20 and a control input of the third current source 30 via a bus line. The second current source 20 is connected to a second output 48 of the circuit arrangement 1 and the third current source 30 is connected to a third output 49 of the circuit arrangement 1. The arrangement comprises a second light-emitting diode 42 provided in serial connection with respect to the second current source 20, and a third light-emitting diode 43 provided in serial connection with respect to the third current source 30. In this arrangement, the second light-emitting diode 42 is arranged between the supply voltage terminal 9 and the second output 48 of the circuit arrangement 1. Similarly, the third light-emitting diode 43 is arranged between the supply voltage terminal 9 and the third output 49 of the circuit arrangement 1. The second light-emitting diode 42 is coupled to the first input 100 of the circuit arrangement 1 via a second node 96 and a second push-button 102. Similarly, the third light-emitting diode 43 is coupled to the first input 100 of the circuit arrangement 1 via a third node 97 and a third push-button 103. The second node 96 is connected to the second output 48 of the circuit arrangement 1 and, in a similar way, the third node 97 is connected to the third output 49 of the circuit arrangement 1. The second push-button 102 comprises first and second terminals. The second light-emitting diode 42 is connected to the second terminal of the second push-button 102 via the second node 96. Further, a terminal of the second light-emitting diode 42 is connected to the supply voltage terminal 9. The second current source 20 is connected to the second terminal of the second push-button 102 via the second node 96. The first terminal of the second push-button 102 is connected to the first input 51 of the comparator 50 via the first input 100 of the circuit arrangement 1. A keypad 4 thus comprises the push-button 101 as well as the second and third push-buttons 102, 103. A light-emitting diode array 7 comprises the light-emitting diode 41 as well as the second and third light-emitting diodes 42, 43.

The first current source 10 is provided for the power supply of the light-emitting diode 41. The current source 10 has first and second operational states A, B which are set by the control device 90 by means of the connection between the output 91 of the control device 90 and the control input of the first current source 10. When the control device 90 puts the current source 10 into the first operational state A, the current source 10 is switched so as to be inactive. Hence, there is no current flow through the first output 47 and the light-emitting diode 41. A voltage VR1 at the first node 95 is thus approximately equal to a supply voltage VDD which is applied to the supply voltage terminal 9. If the first push-button 101 is actuated, the voltage VR1 is fed as a voltage VC1 to the first input 51 of the comparator 50 via the first push-button 101 and the first input 100 of the circuit arrangement 1. The second input 52 is supplied with a reference voltage VREF by the reference voltage source 54. The comparator 50 compares the voltage VC1 applied to the first input 51 with the reference voltage VREF. The reference voltage VREF is set such that in case the first push-button 101 is actuated the voltage VC1 is higher than the reference voltage VREF. If the first push-button 101 is not in an actuated state, however, the connection between the first input 100 of the circuit arrangement 1 and the first input 51 of the comparator 50 via the first drain resistor 55 approximately is at a reference potential VSS which is applied to the reference potential terminal 8. This is why the voltage VC1 at the first input 51 is lower than the reference voltage VREF. Consequently, a signal may be tapped at the output 53 of the comparator, which exhibits the logic value 1 when the first push-button 101 is actuated and has the logic value 0 when the first push-button 101 is not actuated.

In the second operational state B of the current source 10, the current source 10 is switched so as to be active. Therefore a current I1 flows through the current source 10, the first output 47 of the circuit arrangement 1 and the light-emitting diode 41. The voltage VR1 at the first node 95 hence is equal to the supply voltage VDD minus a light-emitting diode voltage VL dropping across the light-emitting diode 41. The voltage VR1 therefore is lower than in the case of the first operational state A of the current source 10. If the first push-button 101 is not actuated, the voltage VR1 will not be fed to the first input 51 of the comparator 50. In case the first push-button 101 is actuated by the user, however, the voltage VR1 is fed to the first input 51 of the comparator 50. The reference voltage VREF is set such that it is higher than the voltage VR1, which is the supply voltage VDD minus the light-emitting diode voltage VL. With this, it can be determined only in the first operational state A of the current source 10 whether the push-button 101 is actuated. An actuation of the push-button 101, in particular depressing the push-button 101 while the current source 10 is in the second operational state B, will not cause any signal change at the output 53 of the comparator 50. The signal provided at the output 53 of the comparator 50 is delivered to the input 92 of the control device 90. Depending on the signal provided at the input 92 of the control device 90, a signal is generated at the output 93 of the control device 90 which comprises the information whether the first push-button 101 is in an actuated or non-actuated operational state.

Similarly, the second and third current sources 20, 30 exhibit the first and second operational states A, B. At most, only one of the three current sources 10, 20, 30 will be in the first operational state A at the same time. The other current sources will then be in the second operational state B. The method for a second or third current source 20, 30 in the first or second operational state A, B, respectively, corresponds to the method for the current source 10. If the second current source 20 is in the first operational state A, for instance, a voltage VR2 at the second node 96 has a high value. By actuating the second push-button 102, the voltage VR2 can be fed to the first input 51 of the comparator 50. Thereby the signal at the output 53 of the comparator 50 assumes the value 1. If the second push-button 102 is not actuated, the signal at the output 53 of the comparator 50 continues to stay at the value 0. While the second current source 20 is in the first operational state A, the two other current sources 10, 30 are in the second operational state B. Operating the first push-button 101 or the third push-button 103 thus will not have the effect that the first input 51 of the comparator 50 is fed with a voltage which is above the reference voltage VREF. This is why the signal at the output 53 of the comparator 50 stays at the logic value 0 even if the first or third push-button 101, 103 is actuated.

Thus it is possible to advantageously arrange that the push-button position of only one push-button is polled, in the present example the second push-button 102. By selecting which one of the current sources 10, 20, 30 is put into the first operational state A, it can be advantageously set which one of the push-buttons is polled. It is of advantage that only very few terminals are required for the circuit arrangement 1 for operating the light-emitting diode array 7 and the keypad 4, namely three outputs 47 to 49 and one input 100, and the number of the connections in the arrangement is kept low.

In an alternative embodiment, an additional light-emitting diode 44 is provided in serial connection with respect to the light-emitting diode 41. In this arrangement, the reference voltage VREF is set such that it is higher than the voltage VR1, which is the supply voltage VDD minus a light-emitting diode voltage VL' across the two light-emitting diodes 41, 44. Likewise, an additional light-emitting diode 45 is provided in serial connection with respect to the second light-emitting diode 42, and an additional light-emitting diode 46 is provided in serial connection with respect to the third light-emitting diode 43.

In an alternative embodiment which is not shown, one or more further light-emitting diodes are provided in serial connection with respect to the light-emitting diode 41 and the additional light-emitting diode 44. Here, the reference voltage VREF is set such that it is higher than the voltage VR1 which is the supply voltage VDD minus the light-emitting diode voltage VL' dropping across the series connection made up of the light-emitting diode 41, the additional light-emitting diode 44 and the further light-emitting diodes.

The control device 90 can be implemented as a digital circuit. The control device 90 can be realized as a state machine. Alternatively, the control device can be formed as a microprocessor or a microcontroller. In an embodiment, the control device 90 can be implemented as a microcontroller of the PIC family, manufactured by Microchip Technology Inc., Chandler, Ariz., for example the microcontroller PIC16F1936. In an alternative embodiment, the control device 90 can be microcontroller P89LPC916, manufactured by NXP Semiconductors, the Netherlands. The microcontroller P89LPC916 comprises an 8051 core.

FIGS. 2A to 2C show three exemplary embodiments of a current source 10, as they may be used as the current source 10 or as second or third current source 20, 30 in the circuit arrangement 1 according to FIGS. 1, 3A, 4A, 4C and 5.

FIG. 2A shows the current source 10 comprising a current sink 11 and a switch 12. The current sink 11 and the switch 12 are serially connected to each other. The serial connection is arranged between an output of the current source 10 and the reference potential terminal 8. The output of the current source 10 is connected to the first output 47 of the circuit arrangement 1. A control terminal of the switch 12 is connected to the output 91 of the control device 90 via the control input of the current source 10. A node between the output of the current source 10 and the serial connection comprising the switch 12 and the current sink 11 is coupled to the supply voltage terminal 9 via a first resistor 16.

The switch 12 is in an open state in the first operational state A of the current source 10. Therefore, a voltage at the output of the current source 10 and thus the voltage VR1 applied to the first output 47 of the circuit arrangement 1 as well as to the first node 95 are determined by the supply voltage VDD and the resistor 16. The voltage VR1 approximately corresponds to the supply voltage VDD. Thus, the light-emitting diode 41 does not shine. In the second operational state B of the current source 10, the switch 12 is in a closed state, so that a current I1 flows through the terminal of the current source 10 and through the current sink 11 to the reference potential terminal 8.

The resistance value of the first resistor 16 advantageously is set such that, in the second operational state B, a major part of the current flowing through the current sink 11 flows through the light-emitting diode 41, and only a small proportion of the current flowing through the current sink 11 flows through the resistor 16.

In an alternative embodiment which is not shown, the first resistor 16 is replaced by a transistor configured as a resistor. This advantageously reduces an operating current.

FIG. 2B shows an alternative current source 10 which is an additional development of the current source shown in FIG. 2A. In the current source 10 shown in FIG. 2B, the current sink 11 is realized as a second resistor 17. The switch 12 as well as the second resistor 17 are serially inserted between the output of the current source 10 and the reference potential terminal 8. The mode of operation of the current source 10 according to FIG. 2B is equivalent to the mode of operation of the current source 10 according to FIG. 2A.

In an alternative embodiment which is not shown, the first and second resistors 16, 17 are each realized as a transistor configured as a resistor.

FIG. 2C shows the current source 10 which is an additional development of the current source shown in FIG. 2A. The current source 10 according to FIG. 2C additionally comprises an inverter 18 and a supply voltage switch 19. The supply voltage switch 19 is inserted between the first resistor 16 and the supply voltage terminal 9. The output 91 of the control device 90 is connected to a control terminal of the supply voltage switch 19 via the inverter 18.

In the first operational state A of the current source 10, the switch 12 is in an open state and the supply voltage switch 19 is in a closed state. Therefore, the voltage at the output of the current source 10 and thus the voltage VR1 applied to the first output 47 of the circuit arrangement 1 as well as to the first node 95, are determined by the supply voltage VDD and the resistor 16. The voltage VR1 is approximately equal to the supply voltage VDD. Consequently, the light-emitting diode 41 does not shine. In the second operational state B of the current source 10, the switch 12 is in a closed state and the supply voltage switch 19 is in an open state, so that a current I1 flows through the terminal of the current source 10 and through the current sink 11 to the reference potential terminal 8.

It is of advantage that no part of the current flowing through the current sink 11 flows through the resistor 16 in the second operational state B, so that the energy efficiency is enhanced.

Figure 3A:
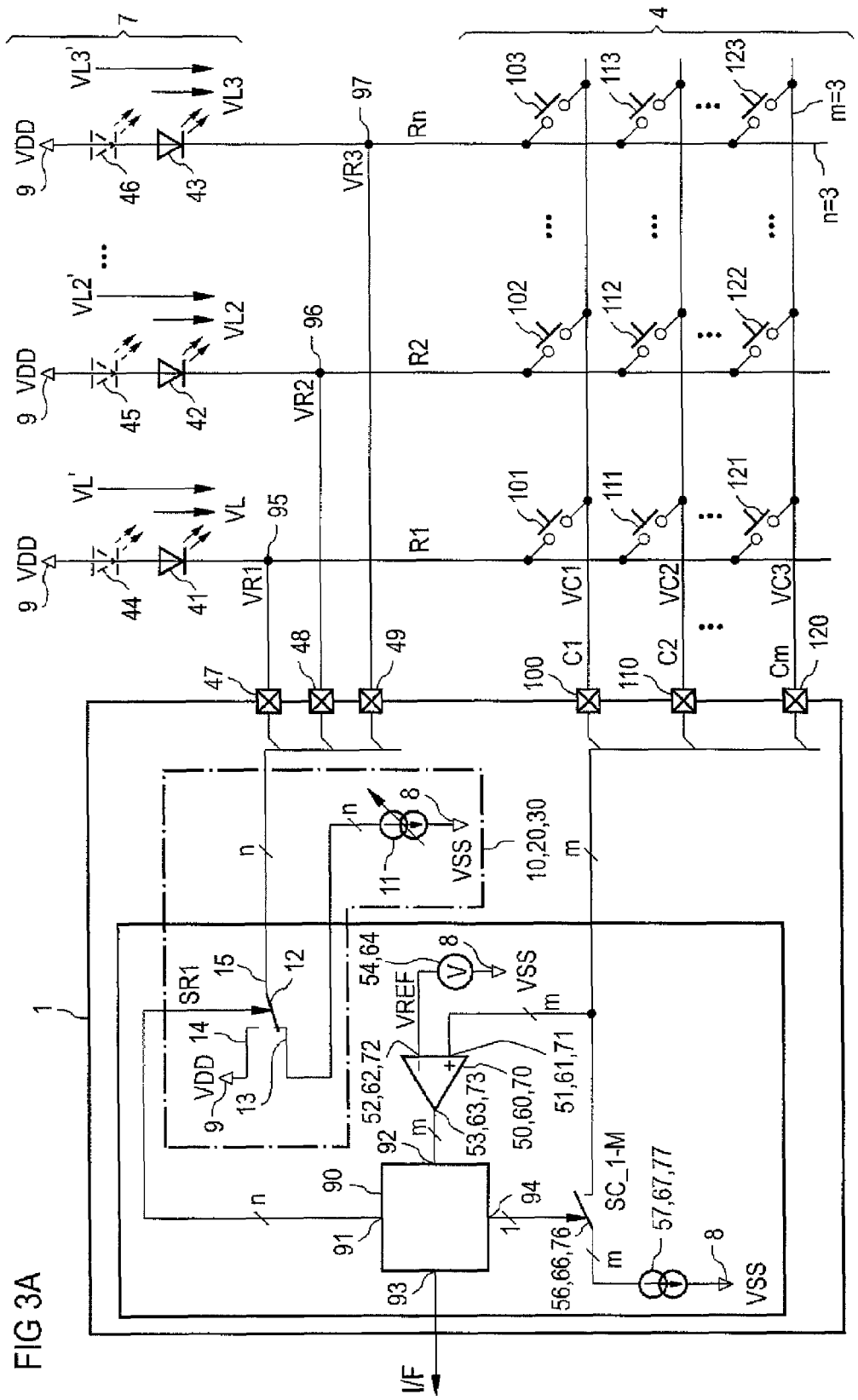

FIG. 3A shows an exemplary embodiment of the arrangement 1 according to the suggested principle, illustrating an additional development of the arrangement according to FIG. 1. The circuit arrangement 1 comprises the current source 10, the comparator 50, the control device 90, the first output 47 and the first input 100. The current source 10 comprises the current sink 11 as well as the switch 12 which is designed as a changeover switch. The switch 12 and the current sink 11 are provided serially with respect to each other between the output of the current sink 10 and the reference potential terminal 8. A first terminal 13 of the switch 12 is connected to the current sink 11. A second terminal 14 of the switch 12 is connected to the supply voltage terminal 9. An output 15 of the switch 12 is connected to the output of the current source 10 and thus to the first output 47 of the circuit arrangement 1. The circuit arrangement 1 comprises a discharge switch 56 and a discharge current source 57, which are provided serially with respect to each other. The discharge switch 56 and the discharge current source 57 are inserted between the first input 51 of the comparator 50 and the reference potential terminal 8. A control input of the discharge switch 56 is connected to an additional output 94 of the control device 90.

The circuit arrangement 1 further comprises second and third current sources 20, 30 which are designed like the current source 10. For reasons of clarity, the second and third current sources 20, 30 are not drawn specifically.

Moreover, the circuit arrangement 1 comprises a second and a third comparator 60, 70 realized like the comparator 50. For reasons of clarity, the second and third comparators 60, 70 are not drawn specifically either. The second comparator 60 has its first terminal 61 coupled to the light-emitting diode 41 via the second input 110 of the circuit arrangement 1 and a further push-button 111. Likewise, the first input 61 of the second comparator 60 is coupled to the second light-emitting diode 42 via the second input 110 and one other push-button 112, and is coupled to the third light-emitting diode 43 via one other push-button 113. A first terminal of the further push-button 111 is connected to the first input 61 of the second comparator 60 via the second input 110. The current source 10 is connected to a second terminal of the further push-button 111 via the first node 95. The light-emitting diode 41 is connected to the second terminal of the further push-button 111 via the first node 95. A reference voltage source 64 is connected to the second input 62 of the comparator 60. The output 63 of the second comparator 60 is coupled to the input 92 of the control device 90. The first input 61 of the second comparator 60 is connected to the reference potential terminal 8 via a second discharge switch 66 and a second discharge current source 67. The third comparator 70 is designed and coupled in a similar way. A first input 71 of the third comparator 70 is coupled to the light-emitting diode 41 via a third input 120 and an further push-button 121, to the second light-emitting diode 42 via one other push-button 122, and to the third light-emitting diode 43 via one other push-button 123. The first input 71 of the third comparator 70 is connected to the reference potential terminal 8 via a third discharge switch 76 and a third discharge current source 77.

The circuit arrangement comprises the keypad 4 and the light-emitting diode array 7. The keypad 4 thus comprises the push-button 101, the second and third push-buttons 102, 103, the further push-buttons 111, 121 as well as the other push-buttons 112, 113, 122, 123. The keypad 4 comprises a first number n of rows and a second number m of columns. The first number n at least assumes the value 1. The second number m at least assumes the value 1. In the exemplary embodiment shown in FIG. 3A, the first number n is equal to 3 and the second number m is equal to 3. The first row R1 is connected to the first node 95, the second row R2 to the second node 96 and the third row Rn to the third node 97. The push-buttons 101, 111, 121 are comprised by the first row R1 of the keypad 4. In a similar way, the second row R2 comprises the push-buttons 102, 112, 122 and the third row Rn comprises the push-buttons 103, 113, 123. The first column C1 is connected to the first input 100 of the circuit arrangement 1, the second column C2 to the second input 110 and the third column Cm to the third input 120. The first column C1 comprises the push-buttons 101, 102, 103. The second column C2 comprises the push-buttons 111, 112, 113 and the third column. Cm comprises the push-buttons 121, 122, 123. At least one light-emitting diode 41, 42, 43 is arranged in each of the rows R1, R2, Rn. The rows R1, R2, Rn are each coupled to a current source 10, 20, 30 for supplying the light-emitting diodes 41, 42, 43. The control device 90 selectively puts the current sources 10, 20, 30 into the first or second operational state. The columns C1, C2, Cm are connected in each case to a first input 51, 61, 71 of a comparator 50, 60, 70.

In the first operational state A of the current source 10, the switch 12 is switched in such a manner that the supply voltage terminal 9 is connected to the output of the current source 10 and thus to the first node 95. In this way, the supply voltage VDD is applied as the voltage VR1 to the first node 95 in the first operational state A. If the push-button 101 is in an actuated state, the supply voltage VDD is fed to the first input 100 and thus to the first input 51 of the comparator 50. As the supply voltage VDD is larger than the adjustable reference voltage VREF, the output 53 of the comparator 50 is biased with the logic value 1 due to the push-button 101 being actuated. If the further push-button 111 and/or the further push-button 121 are in an actuated state, the supply voltage VDD approximately is applied to the first input 61 of the second comparator 60 or the first input 71 of the third comparator 70, respectively. The output 63 of the second comparator 60 is biased with the logic value 1, provided that the additional push-button 111 is in an actuated state. The same applies for the output 73 of the third comparator 70. The second and third current sources 20, are in the second operational state B as soon as the current source 10 is in the first operational state A. In the second current source 20, the current sink therefore is connected to the output of the second current sink 20 and thus to the second output 48 of the circuit arrangement 1 as well as to the second node 96. Consequently, the second light-emitting diode 42 shines. The voltage VR2 at the second node 96 is equal to the supply voltage VDD minus a light-emitting diode voltage VL2 of the second light-emitting diode 42. If the second push-button 102 is actuated, the voltage VR2 applied to the second node 96 will be applied to the first input 51 of the comparator 50. The reference voltage VREF is selected such that the value of the supply voltage VDD minus the value of the light-emitting diode voltage VL2, or—in the case of several serially provided light-emitting diodes 42, 45—minus the value of a light-emitting diode voltage VL2' dropping across the several serially provided light-emitting diodes 42, 45, is lower than the reference voltage VREF. This is why the logic signal 0 is generated at the output of the comparator 50 even if the second switch 102 is actuated. The second inputs 62, 72 of the second and third comparators 60, 70 are supplied with reference voltages which may have the value of the reference voltage VREF fed to the comparator 50.

The discharge switch 56 and the discharge current source 57 achieve the effect that the connections between the first input 51 of the comparator 50 and the push-buttons 101, 102, 103 can be discharged. In doing so, a charge can flow off, for instance, which may have flown to these connection lines with a precedent actuation of one of the push-buttons 101, 102, 103. An erroneous read-out process can be avoided with this. The same applies for the second and third discharge switches 66, 76 and the second and third discharge current sources 67, 77.

Putting the current source 10 into the first operational state A and putting the second and third current sources 20, 30 into the second operational state B advantageously has the effect that a logic signal 1 at the output 53 of the comparator 50 will be effected exclusively by actuating the push-button 101. As it is set by means of the control device 90 which one of the current sources 10, 20, 30 is in the first operational state A, it is determined in this way by the control device 90 whether the first push-button 101 or the second push-button 102 or the third push-button 103 is polled. If the current source 10 is in the first operational state A, it is also possible to detect the state of the further push-button 111 by means of the second comparator 60 and the state of the further push-button 121 by means of the third comparator 70.

The circuit arrangement 1 advantageously comprises only three outputs 47 to 49 for operating the light-emitting diodes 41 to 43, and only three inputs 100, 110, 120 for polling the keypad 4. In doing so, the number of the connection lines is kept very small.

Some of the lines are drawn in as bus lines and are marked with a slash.

In an alternative embodiment which is not shown, the circuit arrangement 1 comprises at least one additional current source which is realized corresponding to the current source 10, as well as at least one additional output coupled to at least one additional light-emitting diode. Thus, at least one additional push-button can be polled.

In an alternative embodiment which is not shown, the circuit arrangement 1 comprises at least one additional comparator which is designed and interconnected like the comparator 50. To this end, the circuit arrangement comprises at least one additional input connected to the at least one additional comparator. Consequently, the circuit arrangement 1 can be used for reading out additional push-buttons in the keypad 4.

The keypad 4 alternatively may have additional rows and/or additional columns.

In an alternative embodiment which is not shown, a drain resistor may be provided in each case instead of the discharge current sources 57, 67, 77.

FIG. 3B shows an exemplary flow of the method for operating the circuit arrangement according to FIG. 3A. The signal and voltage profiles are illustrated versus the time t. FIG. 3B shows the control signals SR1, SR2, SR3 which are delivered to the switch 12 of the current source 10, the switch 22 of the second current source 20 and the switch 32 of the third current source 30, respectively, and the signal SC_1-M fed to the discharge switches 56, 66, 76. Moreover, profiles of the voltages VR1, VR2, VR3 are shown, which are applied to the first, second and third nodes 95, 96, 97, respectively. Furthermore, FIG. 3B shows the voltages VC1, VC2, VC3 which are fed to the first input 100, the second input 110 and the third input 120 of the circuit arrangement 1, respectively.

Between a first moment t1 and a third moment t3, the current sources 10, 20, 30 are in the second operational state B. Therefore, the control signals SR1, SR2, SR3 have the logic value 0. The three current sinks 11, 21, 31 are thus connected to the three outputs 47, 48, 49 of the circuit arrangement 1. The three light-emitting diodes 41, 42, 43 are in a radiating operational state. The voltages VR1, VR2, VR3 have a value resulting from the supply voltage VDD minus the light-emitting diode voltage VL'. Between the first moment t1 and a second moment t2, no push-button is in an actuated state. As the discharge switches 56, 66, 76 are in a closed state according to the signal SC_1-M, the value of the voltages VC1, VC2, VC3 is also approximately 0 between the first moment t1 and the second moment t2. The additional push-button 113 is actuated at moment t2. Thus the voltage VR3 is delivered to the second input 110 of the circuit arrangement via the additional push-button 113, so that the voltage VC2 assumes the value of the voltage VR3. As this voltage is below the reference voltage VREF, no signal at the outputs of the three comparators 50, 60, 70 will be set to the logic value 1, but the three signals remain at the logic value 0.

Between the third moment t3 and a fifth moment t5, the control device 90 provides the control signal SR3 with a logic value 1, so that the third current source 30 is in the first operational state A. The additional current sources 10, continue to stay in the second operational state B. As the voltage VR3 approximately corresponds to the supply voltage VDD, the voltage VC2 at the second input 110 of the circuit arrangement 1 increases, so that the voltage at the first input 61 of the second comparator 60 is above the reference voltage VREF. Therefore, a logic signal 1 is generated at the output 63 of the second comparator 60, which is fed to the control device 90 and made available by the latter as information at the output 93.

In an exemplary illustration in FIG. 3B, the push-button 113 is also in an actuated operational state between the fifth moment t5 and a sixth moment t6. However, as the third current source 30 is back in the second operational state B as from the fifth moment t5 due to the control signal SR3, none of the levels at the first inputs of the three comparators 50 to 70 lies above the reference voltage VREF. Between the sixth moment t6 and a seventh moment t7, the push-buttons of the keypad 4 are back in a non-actuated operational state.

The reference voltage VREF advantageously is in the middle between the supply voltage VDD and the supply voltage VDD minus the light-emitting diode voltage VL or, in the case of several serially arranged light-emitting diodes, minus the light-emitting diode voltage VL' dropping across the several light-emitting diodes.

In one embodiment, the reference voltage VREF of the comparators 50, 60, 70 has a value which is between the supply voltage VDD and the supply voltage VDD minus the smallest one of the light-emitting diode voltages VL, VL2', VL3' of the three rows R1, R2, Rn.

In an alternative embodiment of the method, the first and second current sources 10, 20 are in a third operational state in the time period between the third moment t3 and the fifth moment t5. In the third operational state, one current source is switched so as to have a high impedance.

FIG. 4A shows an exemplary embodiment of the arrangement comprising the circuit arrangement 1, illustrating an additional development of the arrangement of the circuit arrangement according to FIG. 3A. In contrast to the arrangement in FIG. 3A, a first diode 131 is inserted between the first node 95 and the keypad 4 in the arrangement according to FIG. 4A. In a corresponding manner, a second diode 132 is inserted between the second node 96 and the keypad 4, and a third diode 133 is inserted between the third node 97 and the keypad 4.

A short-circuit between the rows R1, R2, Rn of the keypad 4 is advantageously avoided by means of the diodes 131 to 133. If, for instance, the push-button 101 and the second push-button 102 are in an actuated operational state, then the first and second nodes 95, 96 are directly connected to each other in the embodiment according to FIG. 1 or 3A, if no diodes are provided. Without the diodes, for example, a current flow through the second light-emitting diode 42 via the second push-button 102, the push-button 101, the first node 95 and the current source 10 to the reference potential terminal 8 is thus possible. With this, the second light-emitting diode 42 would shine even if the second current source 20 was in a high-impedance state. Due to the first diode 131 it is avoided in this example that a current can flow through the second light-emitting diode 45 to the first node 95.

Advantageously, detection of a double depression of the push-button is possible.

In one embodiment, the diodes 131 to 133 may be realized as Schottky diodes.

FIG. 4B shows an exemplary embodiment of a resistor 134 which may be inserted in the arrangement according to FIG. 4A instead of the first diode 131. Similarly, it is also possible to insert some resistors (not shown in FIG. 4B) in the arrangement according to FIG. 4A instead of the second and third diodes 132, 133. By means of the resistors 134, 135, 136, a short-circuit between the various nodes 95 to 97 owing to double depression of the push-button is also avoided.

Figure 4C:
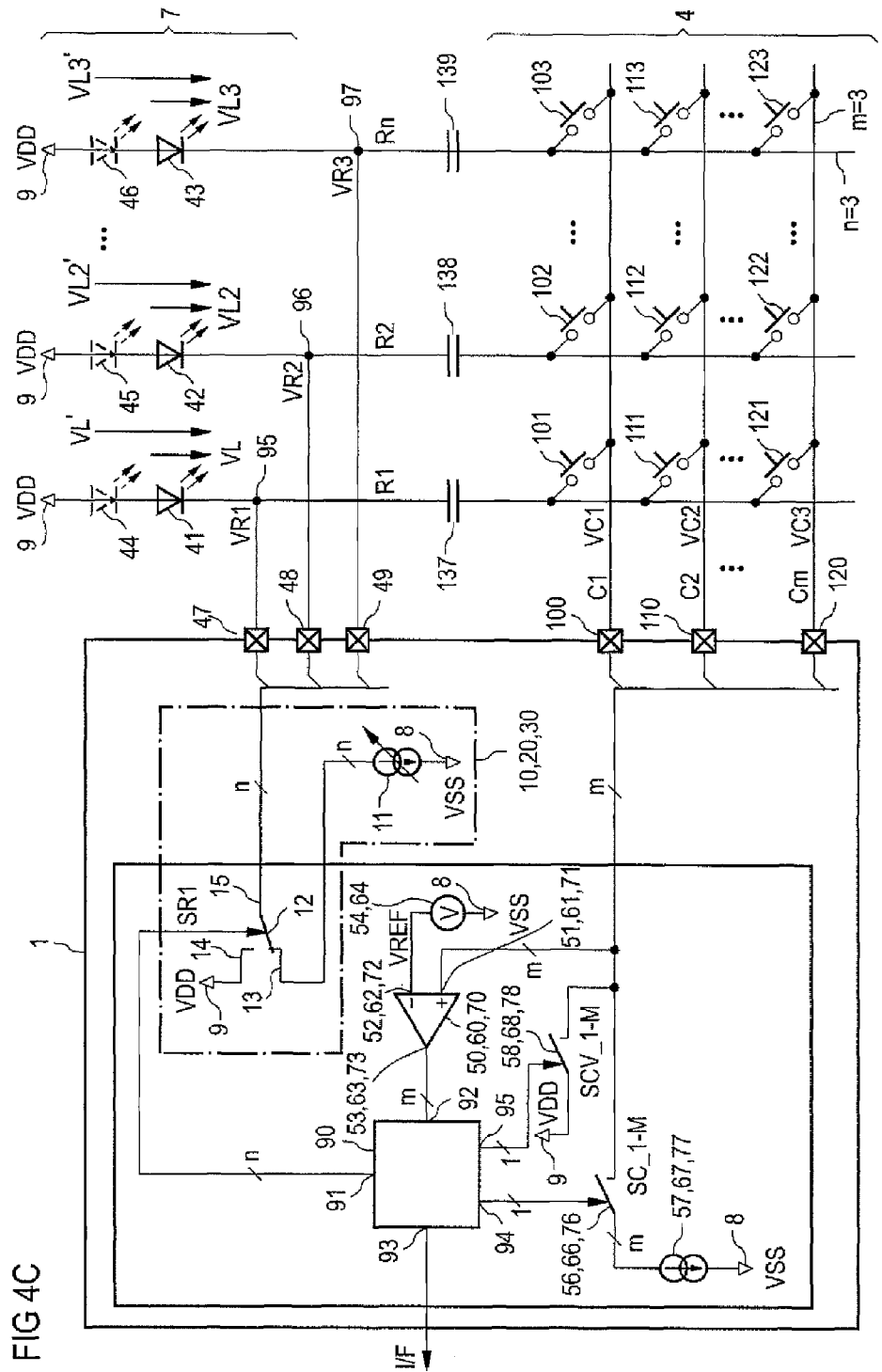

FIG. 4C shows an exemplary embodiment of an arrangement of the circuit arrangement 1, illustrating an additional development of the arrangement of the circuit arrangement according to FIG. 4A. The arrangement according to FIG. 4C comprises first, second and third capacitors 137 to 139 instead of the diodes 131 to 133. Thus, the first node 95 is coupled to the push-button 101, the additional push-button 111 and the additional push-button 121 via the first capacitor 137, which push-buttons are comprised by the first row R1. Similarly, the push-buttons 102, 112, 122 comprised by the second row R2 are coupled to the second node 96 via the second capacitor 138. The push-buttons 103, 113, 123 of the third row Rn of the keypad 4 are coupled to the third node 97 via the third capacitor 139. The circuit arrangement 1 comprises a charge switch 58 connecting the first input 51 of the comparator 50 to the supply voltage terminal 9. The circuit arrangement 1 accordingly comprises second and third charge switches 68, 78 which connect the respective first inputs 61, 71 of the second and third comparators 60, 70 to the supply voltage terminal 9.

The three capacitors 137, 138, 139 are charged in a first step. To this end, the three current sources 10, 20, 30 are put into the first operational state A. Likewise, the three charge switches 57, 67, 77 are also set to be in a closed state by means of a control signal SCV_1-M made available by the control device 90. The two electrodes of the three capacitors 137 to 139 are charged to the supply voltage VDD. Afterwards, the three current sources 10, 20, 30 are put into the second operational state B and the three charge switches 57, 67, 77 into an open state. If, for instance, the second current source 20 is subsequently set so as to be in the first operational state A, the voltage VR2 at the second node 96 increases to the value of the supply voltage VDD. As the voltage across a capacitor only changes in a slow-going manner, the level of the voltage is transferred from the first electrode to the second electrode of the capacitor 138. An additional transfer will be performed to one of the inputs 100, 110, 120 of the circuit arrangement 1, provided that one of the push-buttons 102, 112 or 122 is actuated. The transfer of the signal occurs owing to the physical circumstance that a quick voltage rise at the second node 96 can be transferred to the second terminals of the push-buttons 102, 112, 122 by means of the second capacitor 138. If at least one of the three push-buttons 102, 112, 122 is in an actuated state, the corresponding voltage rise is transferred to the respectively first input 51, 61, 71 of the comparator 50 or of the second or third comparator 60, 70, so that detection of the state of the push-button is possible.

The capacitors 137 to 139 advantageously allow inexpensive decoupling of the rows R1, R2, Rn.

Figure 5:
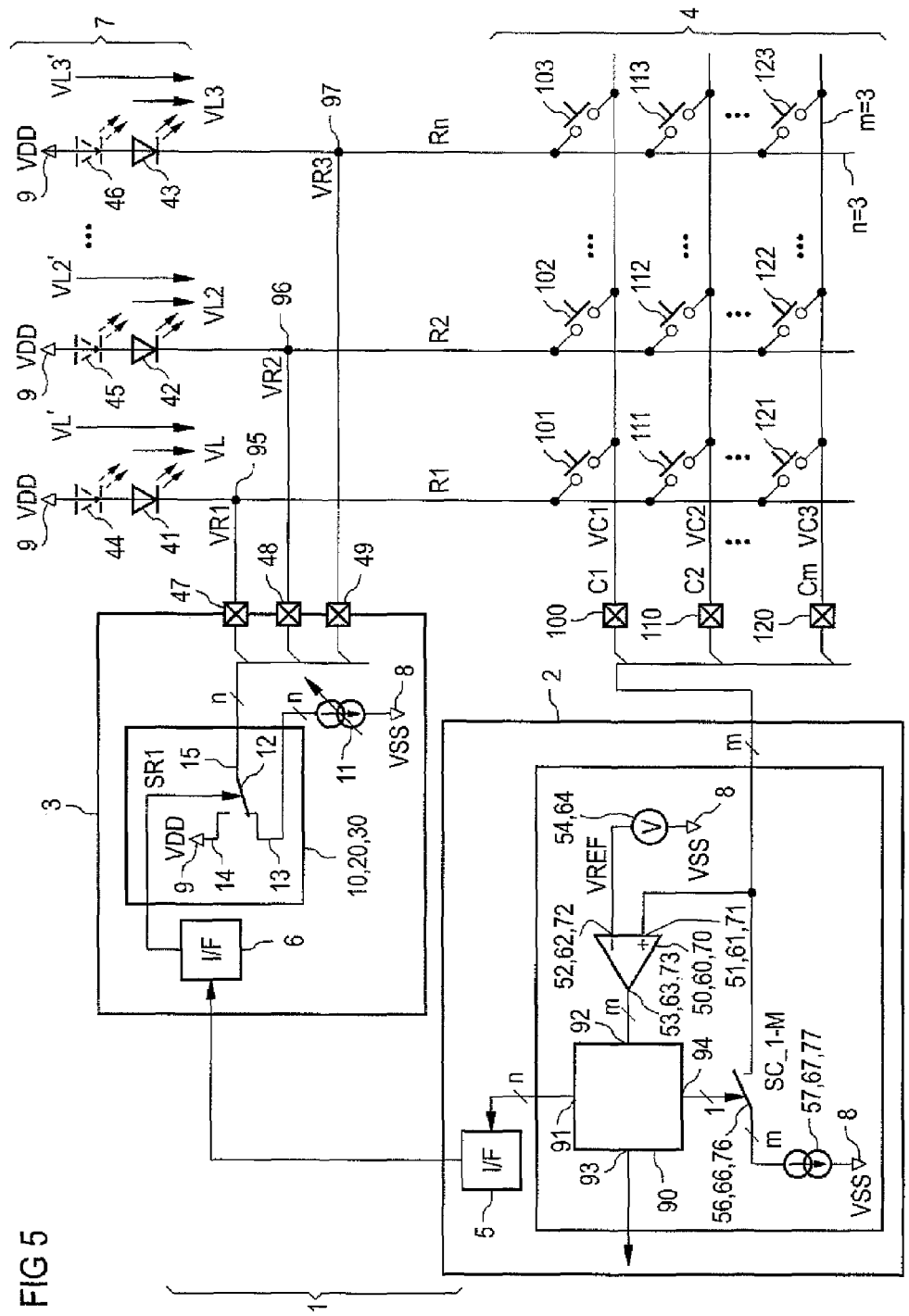
FIG. 5 shows an alternative exemplary embodiment of an arrangement according to the invention.

FIG. 5 shows an exemplary embodiment of the arrangement of the circuit arrangement 1, which is an additional development of the arrangement of the circuit arrangement 1 according to the FIGS. 1, 3A, 4A and 4C. The circuit arrangement 1 comprises first and second semiconductor bodies 2, 3. The first semiconductor body 2 comprises the control device 90, the comparators 50, 60, 70, the discharge switches 56, 66, 76, the discharge current sources 57, 67, 77 as well as the inputs 100, 110, 120. The second semiconductor body 3 comprises the current sources 10, 20, 30 and the outputs 47 to 49. The first semiconductor body 2 has a first interface circuit 5 which is connected to the output 91 of the control device 90. The second semiconductor body 3 comprises a second interface circuit 6 which is connected to the control inputs of the current sources 10, 20, 30. The first interface circuit 5 is connected to the second interface circuit 6.

In an embodiment which is not shown, a base band processor comprises the first semiconductor body 2. The base band processor can advantageously set up the light-emitting diode array 7 in addition to the function of polling the keypad 4. The first and second interface circuits 5, 6 advantageously achieve the effect that the number of the lines between the first semiconductor body 2 and the second semiconductor body 3 is reduced. The method for generating the control signals may be implemented in a software running in the base band processor.

The invention claimed is:

1. A circuit arrangement, comprising:
    a current source for supplying at least one light-emitting diode;
    a comparator which, at a first input is adapted to be coupled to the at least one light-emitting diode via a push-button and, at a second input is adapted to be fed with a reference voltage the value of which is larger than a value of a supply voltage minus a value of a light-emitting diode voltage across the at least one light-emitting diode; and
    a control device which selectively puts the current source into a first operational state for polling a push-button position of the push-button or into a second operational state for emitting radiation by means of the at least one light-emitting diode.

2. The circuit arrangement according to claim 1,
    wherein the current source is switched so as to be inactive in the first operational state and active in the second operational state.

3. The circuit arrangement according to claim 1,
    wherein a terminal of the at least one light-emitting diode is coupled to the current source and to the push-button.

4. The circuit arrangement according to claim 3,
    wherein the current source is directly connected to the terminal of the at least one light-emitting diode and the push-button is directly connected to the terminal of the at least one light-emitting diode.

5. The circuit arrangement according to claim 3,
    wherein the current source is directly connected to the terminal of the at least one light-emitting diode, and the push-button is connected to the terminal of the at least one light-emitting diode via a diode or a resistor or a capacitor.

6. The circuit arrangement according to claim 3,
    wherein the current source comprises a current sink and a switch which are provided in series connection and arranged between the terminal of the at least one light-emitting diode and a reference potential terminal.

7. The circuit arrangement according to claim 6,
    wherein the switch is realized as a changeover switch which is coupled to the current sink at a first terminal, to a supply voltage terminal at a second terminal and to the terminal of the at least one light-emitting diode at an output terminal.

8. The circuit arrangement according to claim 1,
    comprising a discharge current source coupling the first input of the comparator to a reference potential terminal.

9. The circuit arrangement according to claim 1,
    comprising at least one additional current source for supplying at least one additional light-emitting diode, wherein the first input of the comparator is adapted to be coupled to the at least one additional light-emitting diode via at least one additional push-button.

10. The circuit arrangement according to claim 9,
    wherein the control device selectively puts the at least one additional current source into the first operational state for polling a push-button position of the at least one additional push-button or into the second operational state for providing radiation by means of the at least one additional light-emitting diode.

11. The circuit arrangement according to claim 10,
wherein at least one element of the set comprising the current source and the at least one additional current source is simultaneously put into the first operational state by the control device.

12. The circuit arrangement according to claim 9,
wherein one terminal each of the at least one additional light-emitting diode is coupled to the at least one additional current source and to the at least one additional push-button.

13. The circuit arrangement according to claim 1, comprising at least one additional comparator which, at a first input, is adapted to be coupled in each case to the at least one light-emitting diode via at least one further push-button, and, at a second terminal is adapted to be fed with at least one additional reference voltage having a value which is larger than the value of the supply voltage minus the value of the light-emitting diode voltage across the at least one light-emitting diode.

14. The circuit arrangement according to claim 9, further comprising at least one additional comparator which, at a first input is adapted to be coupled in each case to the at least one light-emitting diode via at least one further push-button, and, at a second terminal is adapted to be fed with at least one additional reference voltage having a value which is larger than the value of the supply voltage minus the value of the light-emitting diode voltage across the at least one light-emitting diode,
wherein the first input of the at least one additional comparator is adapted in each case to be coupled to the at least one additional light-emitting diode via at least one other push-button.

15. A method for operating a circuit arrangement, comprising:
putting a current source into a first operational state and polling a push-button position of a push-button with a comparator which is coupled to at least one light-emitting diode via the push-button in such a manner that a voltage at a first terminal of the push-button is compared with a reference voltage the value of which is larger than a value of a supply voltage minus a value of a light-emitting diode voltage across the at least one light-emitting diode; and
putting the current source into a second operational state for supplying the at least one light-emitting diode and providing radiation by means of the at least one light-emitting diode.

16. The method according to claim 15,
wherein a terminal of the at least one light-emitting diode is coupled to a second terminal of the push-button and to the current source.

\* \* \* \* \*